United States Patent [19]

Trumpp et al.

[11] Patent Number: 4,998,101
[45] Date of Patent: Mar. 5, 1991

[54] BROADBAND SIGNAL SWITCHING MATRIX NETWORK

[75] Inventors: Gerhard Trumpp, Puchheim; Jan Wolkenhauer, Munich, both of Fed. Rep. of Germany

[73] Assignee: Siemens Aktiengesellschaft, Berlin and Munich, Fed. Rep. of Germany

[21] Appl. No.: 390,835

[22] Filed: Aug. 8, 1989

[30] Foreign Application Priority Data

Aug. 8, 1988 [EP] European Pat. Off. .......... 88112905

[51] Int. Cl.⁵ ............................................. H04Q 9/00
[52] U.S. Cl. ........................... 340/825.91; 340/825.87; 307/530
[58] Field of Search ............ 340/825.9, 825.91, 825.85, 340/825.86, 825.87, 825.88, 825.89, 825.92, 825.93; 307/530, 241, 451, 452, 571, 481; 379/291, 292, 54, 94; 330/277

[56] References Cited

U.S. PATENT DOCUMENTS

| 3,887,881 | 6/1975 | Hoffmann | 330/277 |
| 3,980,831 | 9/1976 | Mertel | 379/54 |
| 4,074,150 | 2/1978 | Buckley, III et al. | 330/277 |
| 4,074,206 | 2/1978 | Horninger | 307/530 |
| 4,204,277 | 5/1980 | Kinoshita | 307/530 |
| 4,612,514 | 9/1986 | Shigaki et al. | 330/277 |
| 4,788,460 | 11/1988 | Kobatake | 307/530 |
| 4,801,936 | 1/1989 | Hofmann | 340/825.91 |
| 4,820,999 | 4/1989 | Csanky | 330/277 |

FOREIGN PATENT DOCUMENTS

| 0249837 | 6/1987 | European Pat. Off. . |
| 2365263 | 9/1976 | France . |
| 55-117394 | 9/1980 | Japan . |
| 59-61315 | 4/1984 | Japan . |

Primary Examiner—Donald J. Yusko
Assistant Examiner—Peter Weissman
Attorney, Agent, or Firm—Hill, Van Santen, Steadman & Simpson

[57] ABSTRACT

In a broadband signal switching matrix network having a cross-point matrix in FET technology whose switching elements, each controlled by a holding memory cell, are each formed with a series circuit of a switching transistor and of an input transistor, this series circuit (for a switching element situated in the through-connect state) forms a cross-point-associated, one branch of a differential amplifier whose other branch shared by the cross-points connecting to one and the same matrix output line is formed by an identical or similar transistor series circuit of an output amplifier circuit that is individually associated to the matrix output line. Thus, the matrix output line is connected to one terminal of an operating voltage source via a source transistor.

11 Claims, 3 Drawing Sheets

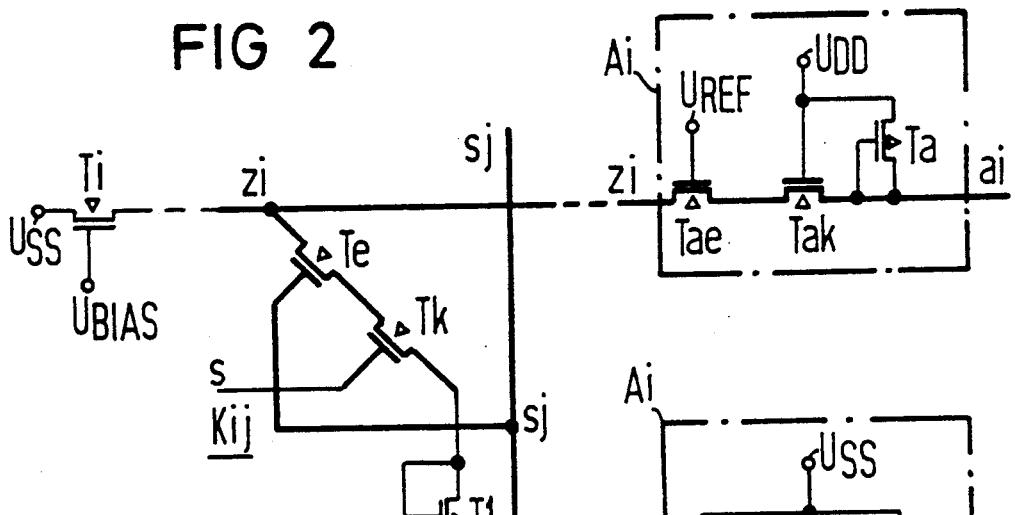
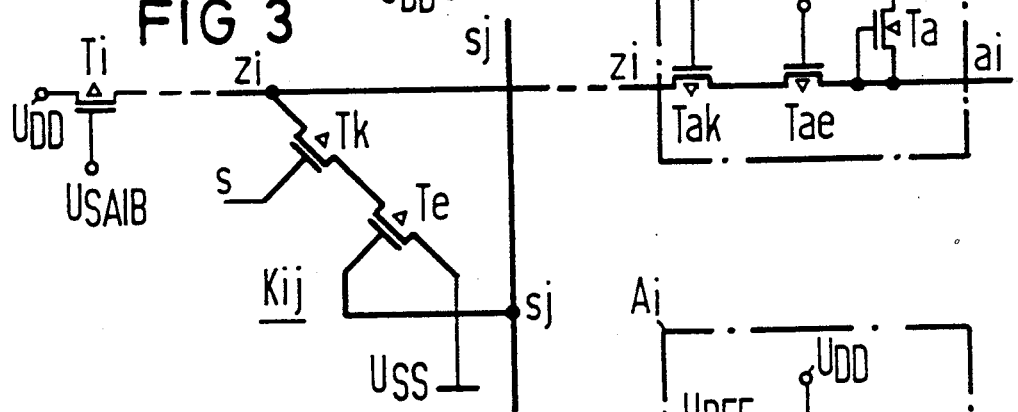
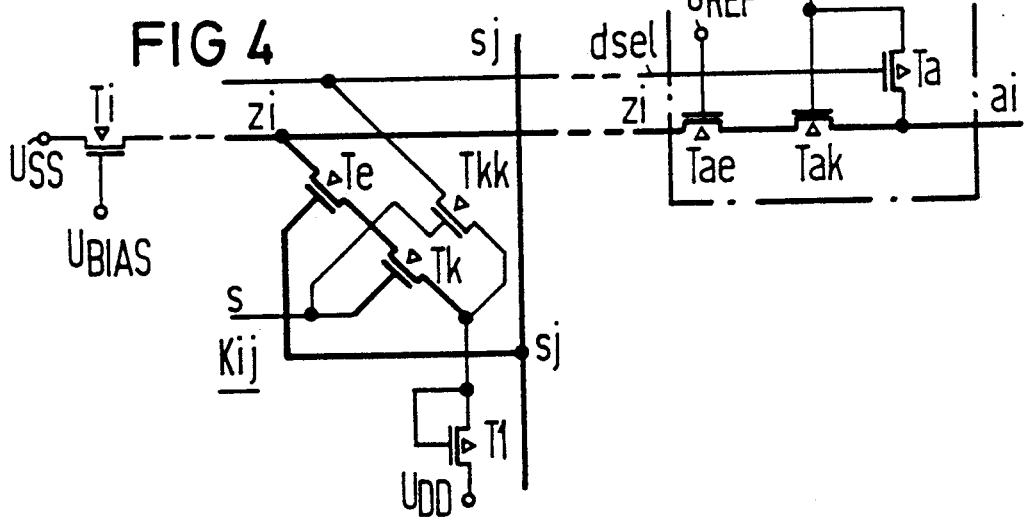

BROADBAND SIGNAL SWITCHING MATRIX NETWORK

BACKGROUND OF THE INVENTION

Modern developments in telecommunications technology have lead to integrated services communications transmission and switching systems for narrow band and broadband communications services that have light waveguides in the region of the subscriber lines as a transmission medium. The light waveguides provide both narrow band communications services such as, in particular, 64 kbit/s digital telephony as well as broadband communications services such as, in particular, 140 Mbit/s picture telephone. As a result narrow band signal switching matrix networks and broadband signals switching matrix networks (preferably having shared control equipment) can also be provided side-by-side in the switching centers (see German Patent 24 21 002).

A known broadband signal switching matrix network (see, for example, European Patent A1 0 262 479) has a cross-point matrix in FET technology whose switching elements are each formed with a switching transistor that has its control electrode charged with a through-connect or inhibit signal and has its main electrode connected to the appertaining matrix output line. The switching elements each have a series transistor forming a series circuit with the switching transistor. This series transistor has its control electrode connected to the appertaining matrix input line and its main electrode connected opposite from the series circuit being connected via a sampling transistor to one terminal of an operating voltage source to whose other terminal the respective matrix output line is connected via a pre-charging transistor. The pre-charging transistor and sampling transistor are respectively charged oppositely from one another at their control electrode with a switching matrix network selection clock that subdivides a bit through-connect time span into a pre-charging phase and into the actual through-connection phase. As a result the matrix output line, for an inhibited sampling transistor, is at least approximately charged in every preliminary phase to the potential at the other terminal of the operating voltage source.

This known broadband signal switching matrix network that can have sampling transistors individually associated to the switching elements or sampling transistors, which are individually associated to the matrix input line or matrix output line, requires separate clock lines that run through the cross-point matrix for selecting these sampling transistors. This requires a circuit surface space requirement and involves a corresponding capacitative load on the matrix output lines. In order to guarantee adequate protection against signal interference, clock distribution and couplings between matrix input lines and matrix output lines require adequately high signal amplitudes on the matrix output lines, this involving a relatively high power consumption.

SUMMARY OF THE INVENTION

An object of the present invention is to provide a broadband signal switching matrix network having limited dissipated power given adequate protection against disruption in which such disadvantages are avoided.

The present invention is directed to a broadband signal switching matrix network having a cross-point matrix in FET technology whose inputs can each be connected to an input driver circuit, whose outputs are provided with an output amplifier circuit, and whose switching elements, which are controlled by a holding memory cell, are each formed with a series circuit of a switching transistor that has its control electrode charged with a through-connect or inhibit signal and an input transistor that has its control electrode connected to the appertaining matrix input line. The series circuit has the main electrode of one transistor, that is connected opposite from the series circuit, connected to the appertaining output line, the matrix output line being connected to the one terminal of the operating voltage source via a transistor. This broadband signal switching matrix network is inventively characterized in that the main electrode of the other transistor, that is connected opposite from the series circuit, is continuously connected to the other terminal of the operating voltage source. Also the transistor series circuit of every switching element forms the cross-point-associated, one branch of a differential amplifier whose other branch, shared by the cross-points connecting to one and same output line, is formed by an output amplifier circuit individually associated to the matrix output line. The amplifier circuit has a output amplifier circuit composed of a first transistor that has its control electrode connected to the other terminal of the operating voltage source and of a second transistor having its control electrode connected to a reference voltage. The series circuit has the main electrode of the one transistor, that is connected opposite from the series circuit, connected to the appertaining matrix output line and that main electrode of the other transistor, that is connected opposite from the series circuit and that is connected to the amplifier output, connected via a load transistor to the other terminal of the operating voltage source.

In addition to providing the advantage that the switching matrix network does not require a clock signal and, thus, corresponding clock lines either for potential input driver circuits or for the cross-point matrix itself or for the output amplifier circuits and that the entire bit through-connect time span, unshortened by a pre-charging phase, is thus also available for the through-connection of the respective bits, the present invention provides a further advantage that the input line can be operated with an extremely small signal boost of, for example, one volt for an operating voltage of, for example, five volts. This produces a corresponding reduction of the signal couplings from the matrix input lines onto the matrix output lines and, thus, a reduction in the dissipated powers. At the same time, the possible reduction in signal boost on the matrix input line, just like the omission of a pre-charging phase, also produces a reduction in disturbances of the operating voltage of the broadband signal switching matrix network caused by power peaks. Moreover, the "distributed" differential amplifier provided according to the present invention also exhibits the known advantages of traditional differential amplifiers.

In a further development of the present invention, the transistor series circuit of every switching element can have its input transistor connected to the matrix output line and the transistor series circuit of the respective output amplifier can have the second transistor connected to the matrix output line. Alternatively thereto, however, it is possible that, in a further development of the present invention, the transistor series circuit of every switching element can have its switching transistor connected to the matrix output line and the transistor series circuit of the respective output amplifier can have its first transistor connected to the matrix output line. This avoids a capacitative loading of the matrix output line by the channel capacitance of the series transistors of switching elements that are not through-connected.

In a further development of the present invention, the transistor series circuit of every switching element can be connected to the other terminal of the operating voltage source via a load transistor. This produces a corresponding symmetry of both branches of the respectively fashioned differential amplifier.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIGS. 2-8 are circuit schematics of circuit-oriented details of the present invention.

DESCRIPTION OF THE PREFERRED EMBODIMENT

Figure 1:
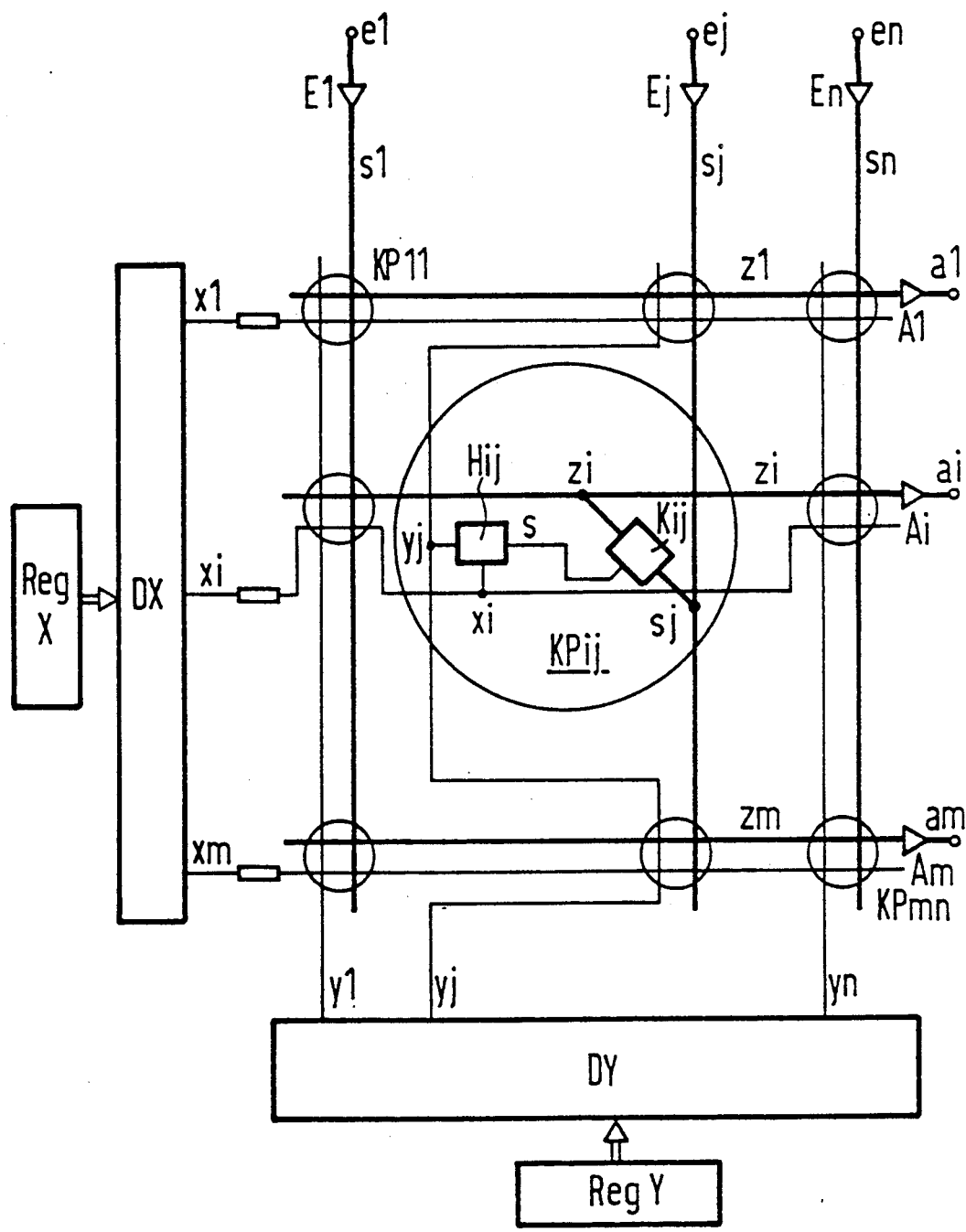
FIG. 1 is a schematic of a broadband switching matrix network.

FIG. 1 schematically depicts a broadband signal switching matrix network in a scope required for an understanding of the present invention. Input driver circuits E1 ... Ej ... En are provided at the input e1 ... ej ... en thereof that connect to column lines s1 ... sj ... sn of a cross-point matrix and the outputs a1 ... ai ... am thereof reached by row lines z1 ... zi ... zm of the cross-point matrix are provided with output amplifier circuits A1 ... Ai ... Am.

The cross-point matrix has cross-points KP11 ... KPij ... KPmn whose switching element (as is indicated in greater detail in the case of the crosspoint KPij for the switching element Kij thereof) can be respectively driven by a cross-point associated holding memory cell Hij (at the cross-point KPij) whose output s connects to the control input of the respective switching element (Kij at the cross-point KPij).

According to FIG. 1, the holding memory cells ... Hij ... are driven in two coordinates by two selection decoders, namely, a row decoder DX and a column decoder DY via corresponding selection lines x1 ... xi ... xm; y1 ... yj ... yn.

As may be seen from FIG. 1, the two selection decoders DX, DY may thereby be chargeable, proceeding from input registers Reg X, Reg Y, with a respective cross-point row address or, respectively, cross-point column address shared by a matrix line (row or column) of cross-points. In response thereto they respectively output a "1" selection signal to the selection line corresponding to the respective cross-point line address. The coincidence of a row selection signal "1" and of a column selection signal "1" at the intersection of the appertaining matrix row with the appertaining matrix column during the set-up of a corresponding call then effects an activation of the holding memory cell situated there, for example, the memory cell Hij. This has the result that the switching element controlled by the appertaining holding memory cell (Hij) becomes conductive, the switching element Kij in the example.

So that the switching element Kij under consideration in the example is again inhibited for a clear down of the appertaining call, the selection decoder DX is again charged with the appertaining row address proceeding from the input register Reg X, so that the row decoder DX again outputs a row selection signal "1" on its output line xi. Simultaneously, the column decoder DY, proceeding from its input register Reg Y, is charged, for example, with a dummy address or with the address of a column of unconnected cross-points, so that it outputs a column selection signal "0" on its output line yj. The coincidence of row selection signal "1" and column selection signal "0" then effects the resetting of the holding memory cell Hij, with the result that the switching element Kij controlled by it is inhibited.

Figure 5:
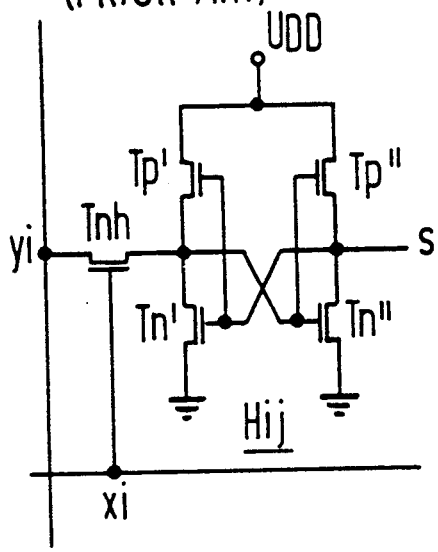
Figure 6:
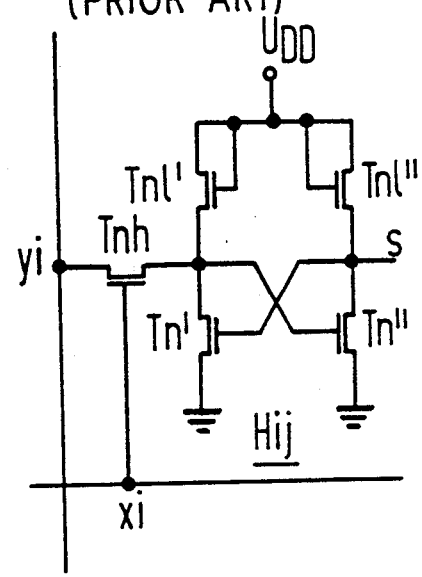

The holding memory cells ... Hij ... can be fashioned in a known manner. Thus, the holding memory cells (as known, for example, by European patent A 0 238 834 and also sketched in FIGS. 5 and 6, can be formed with an n-channel transistor Tnh and two cross-coupled inverter circuits (CMOS inverter circuits Tp'; Tn'; Tp", Tn" in FIG. 5; n-MOS inverter circuits Tnl', Tnl'; Tnl", Tn" in FIG. 6), whereby one inverter circuit has its input side connected to the appertaining decoder output yj of the one selection decoder via the n-channel transistor Tnh that in turn has its control electrode charged with the output signal of the appertaining decoder output xi of the other selection decoder. One inverter circuit has its output side connected to the control input s of the appertaining switching element.

How the switching elements ... Kij ... can be realized in circuit-oriented terms is illustrated in FIGS. 2, 3 and 4; the switching elements ... Kij ... are each formed with a series circuit of a switching transistor Tk that has its control electrode charged with a through-connect or inhibit signal proceeding from the holding memory cell and of an input transistor Te that has its control electrode connected to the appertaining matrix input line sj. The series circuit has the main electrode of the one transistor Tk (in FIG. 3) or Te (in FIG. 2 and FIG. 4), that is connected opposite from the series circuit, connected to the appertaining matrix output line zi. The matrix output line zi is connected to one terminal ($U_{DD}$ in FIG. 3; $U_{SS}$ in FIG. 2 and FIG. 4) of the operating voltage source via a transistor Ti that has its control electrode connected to a corresponding bias voltage ($U_{SAIB}$ in FIG. 3; $U_{BIAS}$ in FIG. 2 and in FIG. 4). The transistor Ti forms a current source together with the respective operating voltage source. The main electrode of the other transistor Te (in FIG. 3 or, Tk (in FIG. 2 and in FIG. 4) that is connected opposite from the series circuit is permanently connected to the other terminals $U_{SS}$, (in FIG. 3) or $U_{DD}$ (in FIGS. 2, 4) of the operating voltage source. The transistor series circuit Tk-Te of every switching element Kij thereby forms the cross-point-associated, one branch of a differential amplifier whose other branch is formed by the output amplifier circuit Ai individually associated to the matrix output line and thus shared by the cross-points connecting to one and the same output lines zi. To that end, the output amplifier circuit Ai has a series circuit of a first transistor Tak that has its control electrode connected to the other terminal, ($U_{SS}$, in FIG. 3; $U_{DD}$ in FIGS. 2 and 4) of the operating voltage source and of a second transistor Tae that has its control electrode connected to a reference voltage ($U_{FER}$ in FIG. 3; $U_{REF}$ in FIGS.

2 and 4). The series circuit has the main electrode of one transistor Tak (in FIG. 3) or Tae (in FIGS. 2 and 4), that is connected opposite from the series circuit, connected to the appertaining matrix output line zi and has the main electrode of the other transistor Tae (in FIG. 3) or Tak (in FIGS. 2 and 4), that is connected opposite from the series circuit and that is connected to the amplifier output Ai, connected to the other terminal ($U_{SS}$, in FIG. 3; $U_{DD}$ in FIGS. 2 and 4) of the operating voltage source via a load transistor Ta that may be connected to as a diode.

As FIGS. 2 and 4 show (differing from FIG. 3), the transistor series circuit Tk-Te of every switching element Kij can be connected to the other terminal ($U_{SS}$, in FIG. 3; $U_{DD}$ in FIG. 2 and in FIG. 4) of the operating voltage source via a load transistor Tl connected as a diode. Such a load transistor guarantees a correspondingly high symmetry of the differential amplifier respectively formed by switching element Kij and output amplifier Ai and, necessitates an additional circuit area requirement. This area requirement is eliminated by an elimination of the cross-point-associated load transistor Tl (in FIGS. 2 and 4) that involves a slight asymmetry of the differential amplifier and therefore requires a slightly higher signal boost.

As may be seen from FIGS. 2 and 4, the transistor series circuit Tk-Te of every switching element Kij can have its input transistor Te connected to the matrix output line zi. In a corresponding fashion, the transistor series circuit Tak-Tae of the output amplifier Ai, individually associated with the matrix output line, then has the second transistor Tae connected to the matrix output line zi. Then as seen proceeding from the matrix output line zi, the input transistor Te is, in a sense, transparent, so that changes in signal status on the matrix input line sj can be transmitted onto the matrix output line zi via the channel capacitance of the input transistor Te even when the switching element Kij is inhibited.

This transmission can be avoided when the sequence of input transistor Te and switching transistor Tk is interchanged in the transistor series circuit Tk-Te of every switching element Kij. As may also be seen from FIG. 3, the transistor series circuit Tk-Te of every switching element Kij then has its switching transistor Tk connected to the matrix output line zi and, in a corresponding way, the transistor series circuit Tak-Tae of the appertaining output amplifier Ai individually associated with the matrix output line has the first transistor Tak connected to the matrix output line zi.

According to the exemplary embodiment sketched in FIG. 4, a signal line dsel, connecting to the control electrode of the output amplifier load transistor, Ta, is provided in addition to every matrix output line, zi, the load transistor Tl of every switching element, Kij, connected to the appertaining matrix output line, zi, being connected to the signal line dsel via an auxiliary transistor Tkk that, just like the switching transistor Tk of the appertaining switching element, Kij, is connected to the control input s thereof. As a result, a differential-to-single-ended conversion of the digital signals through-connected via the appertaining switching element is achieved with a current mirroring from the switching element branch onto the output amplifier branch of the differential amplifier, formed by a switching element, Kij, and the output amplifier circuit Ai individually associated to the matrix output line, thus producing a signal amplification of 6dB but also involving a corresponding circuit space requirement and power requirement.

As FIGS. 2–4 show, the transistors Te, Tae, Ti are of the type complementary to the respective load transistor Ta and, Tl in the respective, so to speak "distributed", differential amplifier formed by the switching element Kij and by the output amplifier circuit Ai.

Figure 7:
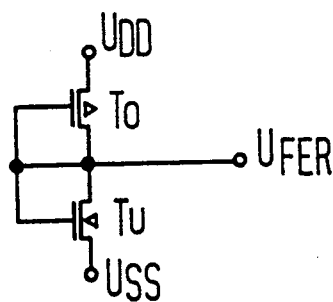

Thus, according to FIGS. 2 and 4, the load transistors Ta and Tl are of the p-channel type, whereas output amplifier transistors Tae and Tak, current source transistor Ti and input transistor Te of the respective switching element, Kij, and the respective switching transistor Tk as well in the exemplary embodiment, are of the n-channel type. The operating voltage source $U_{DD}-U_{SS}$ thereby may output an operating voltage of, for example, five volts that is standard for CMOS circuits from which a reference voltage $U_{REF}$ of, for example, two volts or, respectively, a bias $U_{BIAS}$ of, for example, 1.5 volts that slightly exceeds the threshold voltage of the current source transistor Ti of, for example, 1.2 volts is capable of being derived by a voltage divider circuit having corresponding dimensioned transistors To, Tu and having the form of a fedback inverter circuit, as depicted in FIG. 7.

According to FIG. 3, the output amplifier load transistor Ta is of the n-channel type, whereas the output amplifier transistors Tae and Tak, current source transistor Ti and input transistor Te of the respective switching element, Kij, and also the respective switching transistor Tk in the exemplary embodiment, are of the p-channel type. The operating voltage source $U_{DD}-U_{SS}$ may again output an operating voltage of, for example, five volts that is standard for CMOS systems from which a reference voltage $U_{FER}$ of, for example, 3 volts or, respectively, a current source transistor bias $U_{SAIB}$ of, for example, 3.5 volts is capable of being derived, again by a voltage divider circuit as depicted in FIG. 7.

In order to keep the individual switching elements, Kij, optimally small, the gain of the "distributed" differential amplifier is kept relatively slight. For a further amplification of the output signal that may be required, the output amplifier circuit Ai individually associated to the matrix output line can, for example, be followed by a pseudo-p-MOS or n-MOS amplifier stage. This, however, is no longer shown in the present invention since it is not required for an understanding of the present invention.

As we already set forth above, the reference voltage source for the output amplifier transistor Tae can be formed by a fedback inverter operated as a voltage divider connected to the operating voltage source $U_{DD}-U_{SS}$. Such a CMOS inverter/voltage divider circuit realized with a p-channel transistor To and with an n-channel transistor Tu is shown in FIG. 7. The reference voltage appearing at the output $U_{FER}$ of this CMOS inverter operated as a voltage divider is thereby determined by the dimension of the two transistors To and Tu.

Figure 8:
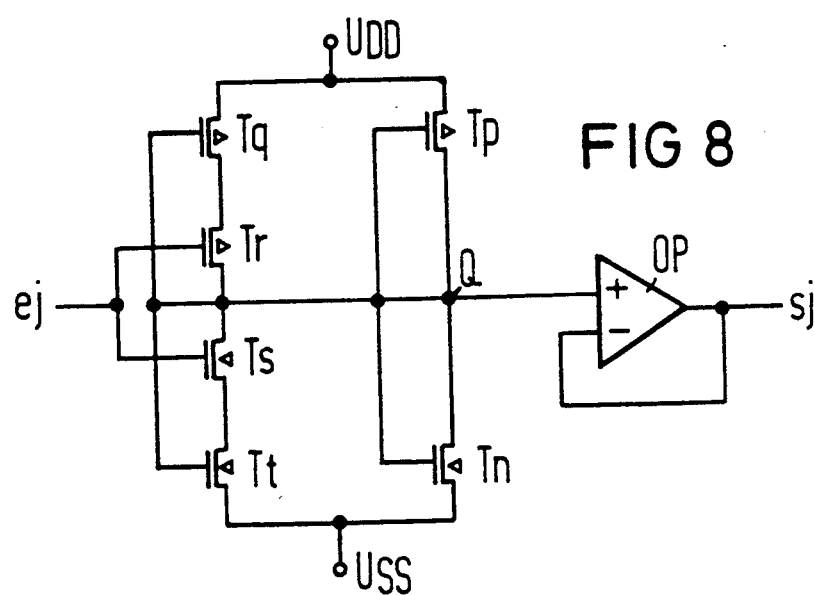

The same transistor dimensions can also be shared by the respective two transistors of fedback CMOS inverters Tp-Tn (see FIG. 8) that form in a respective ring circuit together with a further fedback CMOS inverter circuit Tq-Tr-Ts-Tt (see FIG. 8) input driver circuits . . . Ej . . . provided at the inputs . . . ei . . . of the broadband signal switching matrix network. Ring circuits of two fedback CMOS inverters are known in the prior art (see European Patent A 0 250 933). In the exemplary embodiment depicted in FIG. 8, the further CMOS inverter circuit has a series circuit of two transistors Tq-Tr or Ts-Tt in each of its two circuit branches, the inner transistor Tr or Ts thereof having its control electrode connected to the input ej of the broadband signal switch matrix network.

The switching threshold of the CMOS inverter Tp-Tn is established by the geometrical dimensions of its p-channel transistor Tp connected to one terminal of the operating voltage source $U_{DD}$ and of its n-channel transistor Tn connected to the other terminal of the operating voltage source $U_{SS}$. When the dimensions of the two corresponding transistors (To and Tu) are equivalent in a reference voltage source fashioned as a CMOS inverter/voltage divider circuit according to FIG. 7, the switching threshold lies at the reference voltage output by this reference voltage source. This results, even for fluctuations of the operating voltage $U_{DD}-U_{SS}$ or for a modification of technological parameters, in that the HIGH level and the LOW level of a digital signal, through-connected via the broadband signal switching matrix network proceeding from the switching matrix network input ej, remain constant within broad limits relative to the level of the reference voltage $U_{REF}$ (in FIGS. 2 and 4) or $U_{FER}$ (in FIGS. 3 and 7) effective in the output amplifier circuit Ai (in FIGS. 2–4).

The respective height of the level is thereby determined by the geometrical dimensions of the p-channel transistor Tq connected to the operating voltage source $U_{DD}$ and of the n-channel transistor Tt of the further CMOS inverter circuit that is connected to the operating voltage source $U_{SS}$. For a LOW signal appearing at the switching matrix network input ej, the p-channel transistor Tq of the further CMOS inverter circuit Tq-Tr-Ts-Tt is connected parallel to the p-channel transistor Tp of the fedback CMOS inverter Tp-Tn via the p-channel transistor Tr that is consequently transmissive, and, for a HIGH signal appearing at the switching Matrix network input ej, the n-channel transistor Tt of the further, CMOS inverter circuit Tq-Tr-Ts-Tt is connected parallel to the n-channel transistor Tn of the fedback CMOS inverter Tp-Tn via the n-channel transistor Ts that, consequently, is transmissive. This parallel connection modifies the voltage division ratio respectively effective at the circuit point Q, so that, for the full CMOS signal Boost of, for example, five volts of the digital signals appearing at the switching matrix network input ej (in FIGS. 1 and 8), the signal boost of the digital signals appearing at the output of the input drive circuit Ej (in FIGS. 1 and 8) and, thus, on the appertaining matrix input line sj (in FIGS. 1 and 8) is reduced to a value of, for example one volt. As may also be seen from FIG. 8, these digital signals can thereby be buffered with a differential amplifier OP connected as a voltage follower.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A broadband signal switching matrix network connected to an operating voltage source and having a cross-point matrix with cross-points (KPij) in FET technology, whose inputs (ej–sj) are respectively provided with an input driver circuit (Ej), the input driver circuit (Ej) connecting the input (ej) to a matrix input line (sj), and whose outputs (zi–ai) are each provided with an output amplifier circuit (Ai), the output amplifier circuit (Ai) connecting the output (ai) to a matrix output line (zi); and whose switching elements (Kij), respectively controlled by a holding memory cell (Hij), are each formed with a series circuit of a switching transistor (Tk) that has its control electrode charged with a through-connect or an inhibit signal and of an input transistor (Te) that has its control electrode connected to the appertaining matrix input line (sj), the series circuit having a main electrode of one transistor of the switching and input transistors (Tk or Te) that is connected opposite from the series circuit, connected to the appertaining matrix output line (zi) whereby the matrix output line (zi) is connected to one terminal ($U_{DD}$, $U_{SS}$) of the operating voltage source via a transistor (Ti) comprising a main electrode of the other transistor of the switching and input transistors (Te or Tk) that is connected opposite from the series circuit, permanently connected to the other terminal ($U_{SS}$, $U_{DD}$) of the operating voltage source; and the series circuit of the switching and input transistors (Tk–Te) of every switching element (Kij) forming a cross-point, one branch of a differential amplifier, which has another branch shared by the cross-points (Kpij) connected to one and same output line (zi), formed by the output amplifier circuit (Ai) individually associated to the matrix output line, the output amplifier circuit ($A_i$) having a series circuit of a first transistor (Tak) that has its control electrode connected to one of the terminals ($U_{SS}$, $U_{DD}$) of the operating voltage source and of a second transistor (Tae) that has its control electrode charged with a reference voltage ($U_{REF}$, $U_{FER}$), the series circuit of the first and second transistors having a main electrode of one transistor of the first and second transistors (Tak or Tae) that is connected opposite from the series circuit, connected to the appertaining matrix output line (zi) and a main electrode of the other transistor of the first and second transistors (Tae or Tak) that is connected opposite from the series circuit and that is connected to the amplifier output (ai) connected to one of the terminals ($U_{SS}$, $U_{DD}$) of the operating voltage source via a load transistor (Ta).

2. The broadband signal switching matrix network according to claim 1, wherein the main electrode of the other transistor of the series circuit of the switching and input transistors (Tk–Te) of every switching element (Kij) is connected to one of the terminals ($U_{SS}$, $U_{DD}$) of the operating voltage source via a load transistor (Tl).

3. The broadband signal switching matrix network according to claim 1, wherein the series circuit of the switching and input transistors (Tk–Te) of every switching element (Kij) has its switching transistor (Tk) connected to the matrix output line (zi) and the series circuit of the first and second transistors (Tak–Tae) of the respective output amplifier (Ai) has the first transistor (Tak) connected to the matrix output line (zi).

4. The broadband signal switching matrix network according to claim 1, wherein series circuit of the switching and input transistors (Tk–Te) of every switching element (Kij) has its input transistor (Te) connected to the matrix output line (zi) and the series circuit of the first and second transistors (Tak–Tae) of the respective output amplifier (Ai) has the second transistor (Tae) connected to the matrix output line (zi).

5. The broadband signal switching matrix network according to claim 1, wherein a feedback CMOS inverter (To, Tu) is provided as the reference voltage source.

6. The broadband signal switching matrix network according to claim 5, wherein each input driver circuit (Ej) preceding the matrix input lines (sj) is formed with a feedback CMOS inverter (Tp, Tn) having the same transistor dimensions that forms a ring circuit with a further, feedback CMOS inverter circuit (Tq, Tr, Ts, Tt) whereby this further CMOS inverter circuit has a series circuit of two transistors (Tq, Tr; Ts, Tt) in each of its two circuit branches, the respectively inner transistor (Tr; Ts) thereof having its control electrode connected to the input ($e_j$) of the broadband signal switching matrix network.

7. The broadband signal switching matrix network according to claim 6, wherein the CMOS inverter (Tp, Tn) is followed by a differential amplifier (OP) connected as a voltage follower.

8. A broadband signal switching matrix network connected to an operating voltage source and having a cross-point matrix with cross-points (KPij) in FET technology, whose inputs (ej-sj) are respectively provided with an input driver circuit (Ej), the input driver circuit (Ej) connecting the input (ej) to a matrix input line (sj), and whose outputs (zi-ai) are each provided with an output amplifier circuit (Ai), the output amplifier circuit (Ai) connecting the output (ai) to a matrix output line (zi); and whose switching elements (Kij), respectively controlled by a holding memory cell (Hij), are each formed with a series circuit of a switching transistor (Tk) that has its control electrode charged with a through-connect or an inhibit signal and of an input transistor (Te) that has its control electrode connected to the appertaining matrix input line (sj), the series circuit having a main electrode of one transistor of the switching and input transistors (Tk or Te) that is connected opposite from the series circuit, connected to the appertaining matrix output line (zi) whereby the matrix output line (zi) is connected to one terminal ($U_{DD}$, $U_{SS}$) of the operating voltage source via a transistor (Ti) comprising a main electrode of the other transistor of the switching and input transistors (Te or Tk) that is connected opposite from the series circuit, permanently connected to the other terminal ($U_{SS}$, $U_{DD}$) of the operating voltage source; and the series circuit of the switching and input transistors (Tk-Te) of every switching element (Kij) forming a cross-point, one branch of a differential amplifier, which has another branch shared by the cross-points (Kpij) connected to one and same output line (zi), formed by the output amplifier circuit (Ai) individually associated to the matrix output line, the output amplifier circuit (Ai) having a series circuit of a first transistor (Tak) that has its control electrode connected to one of the terminals ($U_{SS}$, $U_{DD}$) of the operating voltage source and of a second transistor (Tae) that has its control electrode charged with a reference voltage ($U_{REF}$, $U_{FER}$), the series circuit of the first and second transistors having a main electrode of one transistor of the first and second transistors (Tak or Tae) that is connected opposite from the series circuit, connected to the appertaining matrix output line (zi) and a main electrode of the other transistor of the first and second transistors (Tae or Tak) that is connected opposite from the series circuit and that is connected to the amplifier output (ai) connected to one of the terminals ($U_{SS}$, $U_{DD}$) of the operating voltage source via a load transistor (Ta), a feedback CMOS inverter (To, Tu) being provided as the reference voltage source, each input driver circuit (Ej) preceding the matrix input lines (sj) being formed with a feedback MOS inverter (Tp, Tn) having the same transistor dimensions that forms a ring circuit with a further, feedback CMOS inverter circuit (Tq, Tr, Ts, Tt) whereby this further CMOS inverter circuit has a series circuit of two transistors (Tq, Tr; Ts, Tt) in each of its two circuit branches, the respectively inner transistor (Tr; Ts) thereof having its control electrode connected to the input (ej) of the broadband signal switching matrix network.

9. The broadband signal switching matrix network according to claim 8, wherein the main electrode of the other transistor of the series circuit of the switching and input transistors (Tk-Te) of every switching element (Kij) is connected to one of the terminals ($U_{SS}$, $U_{DD}$) of the operating voltage source via a load transistor (Tl).

10. The broadband signal switching matrix network according to claim 8, wherein the series circuit of the switching and input transistors (Tk-Te) of every switching element (Kij) has its switching transistor (Tk) connected to the matrix output line (zi) and the series circuit of the first and second transistors (Tak-Tae) of the respective output amplifier (Ai) has the first transistor (Tak) connected to the matrix output line (zi).

11. The broadband signal switching matrix network according to claim 8, wherein the series circuit of the switching and input transistors (Tk-Te) of every switching element (Kij) has its input transistor (Te) connected to the matrix output line (zi) and the series circuit of the first and second transistors (Tak-Tae) of the respective output amplifier (Ai) has the second transistor (Tae) connected to the matrix output line (zi).

* * * * *